(12) United States Patent
Hera et al.

(10) Patent No.: US 10,305,439 B2
(45) Date of Patent: May 28, 2019

(54) VEHICLE ENGINE SOUND MANAGEMENT

(71) Applicant: Bose Corporation, Framingham, MA (US)

(72) Inventors: Cristian M. Hera, Lancaster, MA (US);
Peter Raymond, Somerville, MA (US);
Samuel Rhee, Northborough, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 16/004,720

(22) Filed: Jun. 11, 2018

(65) Prior Publication Data

US 2018/0294789 A1    Oct. 11, 2018

Related U.S. Application Data

(62) Division of application No. 15/058,553, filed on Mar. 2, 2016, now Pat. No. 10,020,788.

(51) Int. Cl.
| | | |
|---|---|---|
| *H04B 1/00* | (2006.01) | |
| *H03G 3/00* | (2006.01) | |
| *H03G 9/14* | (2006.01) | |
| *H04R 29/00* | (2006.01) | |
| *G10K 15/02* | (2006.01) | |
| *G10K 15/08* | (2006.01) | |

(52) U.S. Cl.
CPC .............. *H03G 9/14* (2013.01); *G10K 15/02* (2013.01); *H04R 29/00* (2013.01); *G10K 15/08* (2013.01); *H04R 2499/13* (2013.01)

(58) Field of Classification Search
CPC ...... H04R 29/00; H04R 2499/13; H03G 9/14;
H03G 3/32; G10K 15/02; G10K 15/08;
G10K 15/178; G10K 15/1782; G10K 15/1784; G10K 15/1786; G10K 15/1788
USPC ........ 381/86, 71.14, 71.13, 71.9, 71.8, 71.1, 381/61, 56
See application file for complete search history.

(56) References Cited

U.S. PATENT DOCUMENTS

| | | |
|---|---|---|
| 5,404,409 A | 4/1995 | Nagami et al. |
| 8,290,180 B2 | 10/2012 | Yamada et al. |
| 8,320,581 B2 | 11/2012 | Hera et al. |

(Continued)

FOREIGN PATENT DOCUMENTS

| | | |
|---|---|---|
| EP | 2878515 A1 | 6/2015 |
| WO | 0186631 A2 | 11/2001 |

OTHER PUBLICATIONS

International Search Report & Written Opinion in counterpart International Patent Application No. PCT/US17/19830, dated Jun. 7, 2017; 20 pages.

(Continued)

*Primary Examiner* — Xu Mei
(74) *Attorney, Agent, or Firm* — Schmeiser, Olsen & Watts LLP

(57) ABSTRACT

An active sound management system comprises a transducer that senses an actual sound or vibration from a sound generating source and generates a transducer signal in response to sensing the actual sound or vibration; a harmonic extractor device that extracts a plurality of harmonics from the transducer signal; and a harmonic modifier device that adjusts a feature of the extracted harmonic to be within a predetermined threshold with respect to a target harmonic corresponding to a desired sound.

12 Claims, 6 Drawing Sheets

(56) References Cited

U.S. PATENT DOCUMENTS

| | | |
|---|---|---|
| 8,885,845 B2 | 11/2014 | Honji et al. |
| 8,892,046 B2 | 11/2014 | Hera |
| 9,269,344 B2 | 2/2016 | Pan |
| 10,020,788 B2 * | 7/2018 | Hera .................... H03G 9/14 |
| 2012/0106748 A1 * | 5/2012 | Peachey ................ B60Q 5/00 |
| | | 381/61 |
| 2013/0259259 A1 | 10/2013 | Hera |
| 2014/0205110 A1 | 7/2014 | Hera |
| 2015/0003618 A1 | 1/2015 | Hera |
| 2015/0010163 A1 | 1/2015 | Ganeshkumar et al. |
| 2015/0170629 A1 * | 6/2015 | Christoph ............... G10H 5/00 |
| | | 381/61 |
| 2015/0197195 A1 | 7/2015 | Hera et al. |
| 2015/0279346 A1 | 10/2015 | Hera |
| 2015/0358725 A1 | 12/2015 | Hera et al. |

OTHER PUBLICATIONS

Requirement for Restriction/Election in U.S. Appl. No. 15/058,553, dated Sep. 6, 2017; 7 pages.
Non-Final Office Action in U.S. Appl. No. 15/058,553, dated Oct. 18, 2017; 9 pages.
Notice of Allowance in U.S. Appl. No. 15/058,553, dated Mar. 14, 2018; 8 pages.
International Preliminary Report on Patentability in PCT/US2017/019830 dated Sep. 13, 2018; 13 pages.

\* cited by examiner

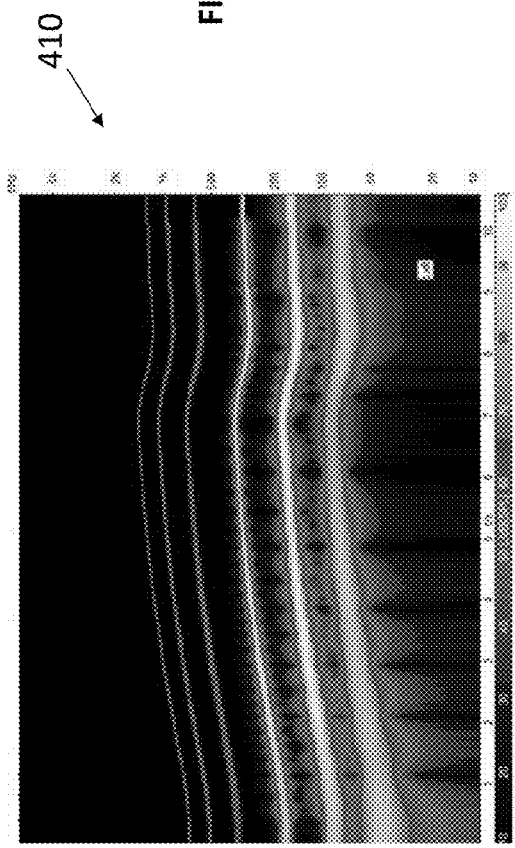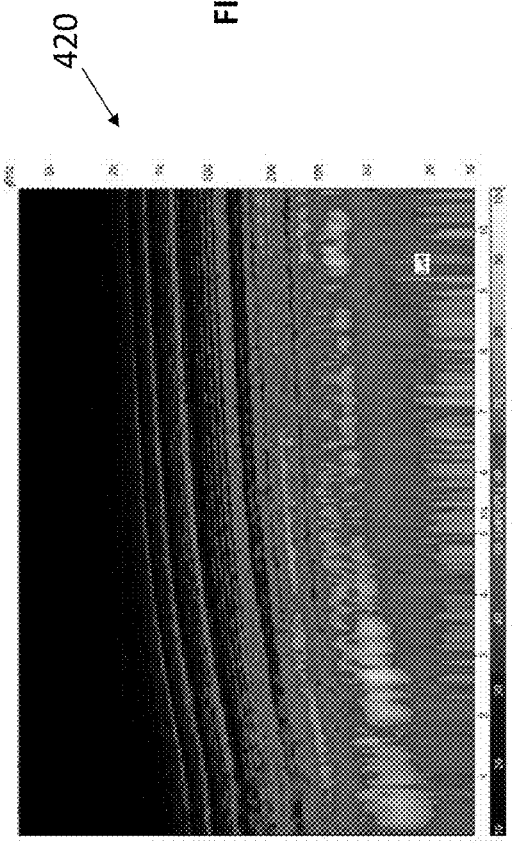

VEHICLE ENGINE SOUND MANAGEMENT

RELATED APPLICATIONS

This invention is a divisional application of U.S. nonprovisional patent application Ser. No. 15/058,553, filed Mar. 2, 2016, and entitled "Vehicle Engine Sound Management," the contents of which are included entirely herein by reference.

BACKGROUND

This disclosure relates generally to sound enhancement, and more specifically to systems and methods for generating natural vehicle engine harmonics and adjusting them in accordance with predefined targets to modify a sonic and/or vibratory experience of a vehicle cabin occupant or person nearby the vehicle.

BRIEF SUMMARY

In one aspect, provided is an active sound management system, comprising: a transducer that senses an actual sound or vibration from a sound generating source and generates a transducer signal in response to sensing the actual sound or vibration; a harmonic extractor device that extracts a plurality of harmonics from the transducer signal; and a harmonic modifier device that adjusts a feature of the extracted harmonic to be within a predetermined threshold with respect to a target harmonic corresponding to a desired sound.

Aspects may include one or more of the following features:

The harmonic extractor device may comprise a reference frequency calculator that receives a signal indicative of rotating speed of the sound generating source, and determines from the signal a fundamental frequency of the harmonics of the sound generating source; and a harmonic decomposer that multiplies the fundamental frequency of the harmonics by an order of each harmonic for calculating harmonic frequencies, and extracts the harmonics from the signal generated by the transducer accordingly.

The sound generating source may include a vehicle engine.

The harmonic modifier device may comprise a target calculator that generates a plurality of target harmonics related to a fundamental frequency of an input signal; an envelope detector that generates from a plurality of harmonic signals extracted from an engine sound a plurality of estimate values that provide an estimated envelope of the corresponding harmonic signals; a gain calculator that processes the estimate values and the target harmonics for determining individual gain adjustments for the extracted harmonic signals; and a plurality of gain devices that generate adjusted harmonic signals from the gain adjustments and the extracted harmonic signals.

The estimated envelope may be provided from a smoothing process over a window of time.

The target calculator may comprise a load processor that converts a torque measurement in the input signal representative of a vehicle state parameter received by the target calculator to an engine load measurement, and determine a harmonic magnitude and phase as a function of RPM data and engine load data provided in the input signal.

The target calculator may comprise a plurality of harmonic lookup tables (LUTs), which associate values of the received RPM data with fundamental frequency values, and determines the target harmonics values.

In another aspect, provided is a harmonic modifier device, comprising: a target calculator that generates a plurality of target harmonics related to a fundamental frequency of an input signal; an envelope detector that generates from a plurality of harmonic signals extracted from an engine sound a plurality of estimate values that provide an estimated envelope of the corresponding harmonic signals from a smoothing process over a window of time; a gain calculator that processes the estimate values and the target harmonics for determining individual gain adjustments for the extracted harmonic signals and a plurality of gain devices that generate adjusted harmonic signals from the gain adjustments and the extracted harmonic signals.

Aspects may include one or more of the following features:

The target calculator may comprise a load processor that converts a torque measurement in the input signal representative of a vehicle state parameter received by the target calculator to an engine load measurement, and determine a harmonic magnitude and phase as a function of RPM data and engine load data provided in the input signal.

The target calculator may comprise a plurality of harmonic lookup tables (LUTs), which associate values of the received RPM data with fundamental frequency values, and determines the target harmonics values.

In another aspect, provided is a vehicle engine harmonic signal enhancement system, comprising: a device that provides a fundamental frequency corresponding to an revolutions per minute (RPM) of a vehicle engine; a transducer that generates a signal in response to sensing an output from the vehicle engine; a harmonic extractor that extracts the individual harmonics from the transducer signal; a comparator that compares each extracted harmonic with a target harmonic corresponding to a desired engine sound heard in a vehicle cabin proximal the vehicle engine; and a harmonic modifier that adjusts a feature of the extracted harmonic to be within a threshold with respect to the target harmonic.

Aspects may include one or more of the following features:

The sound generating source may be at least one of a vehicle cabin, engine, intake, or exhaust.

The feature of the harmonics may include a magnitude, phase, and/or frequency of the extracted harmonic.

The harmonic extractor device may comprise a reference frequency calculator that receives a signal indicative of rotating speed of the sound generating source, and determines from the signal a fundamental frequency of the harmonics of the sound generating source; and a harmonic decomposer that may multiply the fundamental frequency of the harmonics by an order of each harmonic for calculating harmonic frequencies, and may extract the harmonics from the signal generated by the transducer accordingly.

The harmonic modifier device may comprise a target calculator that generates a plurality of target harmonics related to a fundamental frequency of an input signal; an envelope detector that may generate from a plurality of harmonic signals extracted from an engine sound a plurality of estimate values that provide an estimated envelope of the corresponding harmonic signals; a gain calculator that may process the estimate values and the target harmonics for determining individual gain adjustments for the extracted harmonic signals; and a plurality of gain devices that may generate adjusted harmonic signals from the gain adjustments and the extracted harmonic signals.

The estimated envelope may be provided from a smoothing process over a window of time.

The target calculator may comprise a load processor that converts a torque measurement in the input signal representative of a vehicle state parameter received by the target calculator to an engine load measurement, and determines a harmonic magnitude and phase as a function of RPM data and engine load data provided in the input signal.

The target calculator may comprise a plurality of harmonic lookup tables (LUTs), which associate values of the received RPM data with fundamental frequency values, and determines the target harmonics values.

BRIEF DESCRIPTION OF THE SEVERAL VIEWS OF THE DRAWINGS

The above and further advantages may be better understood by referring to the following description in conjunction with the accompanying drawings, in which like numerals indicate like structural elements and features in various figures. The drawings are not necessarily to scale, emphasis instead being placed upon illustrating the principles of the concepts.

FIGS. 6A and 6B are spectrogram graphs of an example comparison, where FIG. 6A represents harmonics generated in a conventional engine harmonic enhancement (EHE) system and FIG. 6B represents harmonics extracted in accordance with some examples.

DETAILED DESCRIPTION

Though the elements of several views of the drawings may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog signal lines, digital signal lines, a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals or video signals or both may be encoded and transmitted in either digital or analog form; conventional digital-to-analog or analog-to-digital converters may not be shown in the figures.

Some engine harmonic enhancement methods combine signals representing synthetically created or extracted harmonics from an engine, either recorded or captured through a sensor, with signals corresponding to the actual engine sound to enhance or otherwise reproduce a particular engine sound character. Accordingly, in a relatively quiet vehicle, such as an electrically powered vehicle, such an enhancement can provide an indication to the driver that the electrical motor is operating and to provide a sensory indication to operating conditions of the vehicle, for example the speed at which the vehicle is traveling. In a hybrid vehicle, the sound enhancement system may provide to the driver a consistent sonic experience, despite changes from internal combustion power to electric motor power. An engine sound enhancement system may allow the occupants of a vehicle to experience the engine sound at a loud or otherwise stimulating level, without being annoyingly loud to persons outside the vehicle.

Figure 1:
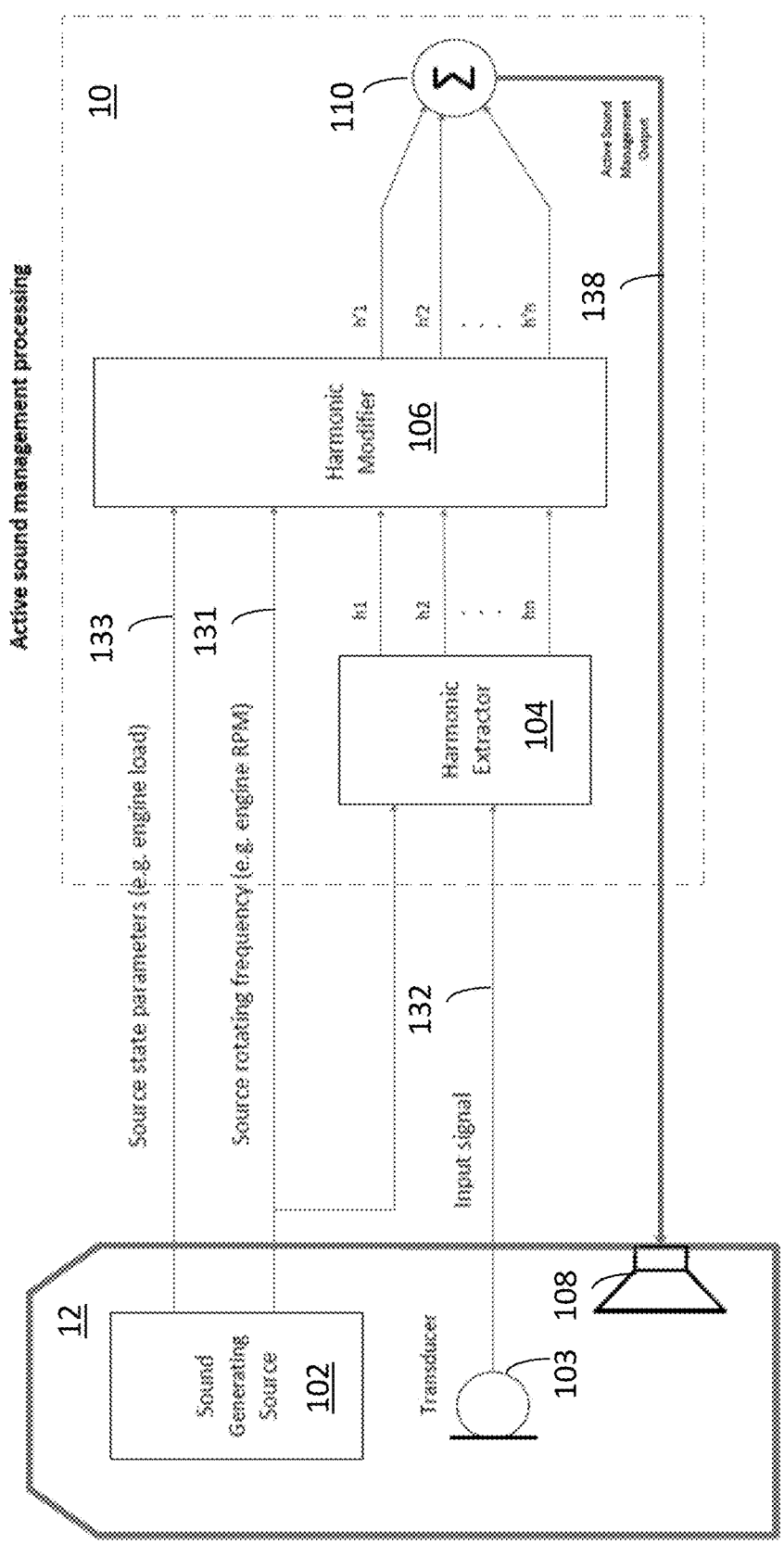
FIG. 1 is a block diagram of an active sound management system, in accordance with some examples.

FIG. 1 is a block diagram of an active sound management system 10, in accordance with some examples.

As shown in FIG. 1, the system 10 includes a harmonic extractor 104 that receives and processes an RPM signal 131 from a sound generating source 102 and a signal 132 from a transducer 103 such as a microphone, an accelerometer, or other sensing devices. In some examples, the sound generating source 102 is a vehicle engine, for example, an electric motor. The RPM signal 131 represents a number of revolutions per minute of a vehicle engine or related sound generating source 102. The RPM signal 131 provides for the harmonic extractor 104 a fundamental frequency of the engine harmonics, which may be used as a reference. The RPM signal 131 can be an analog signal over a wire or a digital signal over a bus or related medium for exchanging mechanical and/or electronic signals. The RPM signal 131 may be received from an ignition module, a crankshaft sensor, or other electronic device part of, or in communication with, the sound generating source 102.

The transducer 103 detects a form of energy generated by the sound generating source 102 such as sound waves, pressure, vibration, and so on, and in response generates a transducer signal 132, which is input to the harmonic extractor 104 for processing along with the RPM signal 131. The transducer 103 may include one or more sensors located near a vehicle engine, a vehicle exhaust, a vehicle cabin (for example, cabin 12 shown in FIG. 1), and/or other locations from where sound waves, pressure, vibration, and so on, can be received, processed, and used to produce a desired sound signal. In some examples, multiple transducers may be positioned at different locations so that different harmonics may be obtained for processing by the active sound management system.

The harmonic extractor 104 performs a harmonic decomposition on the transducer signal 132 to extract a set of harmonics of the actual engine sound, and outputs the extracted harmonics $h_1$-$h_n$ to a harmonic modifier 106 in view of the reference frequency determined from the RPM signal 131. The extracted harmonics $h_1$-$h_n$ contain frequency components at and near the multiples of fundamental frequency of the RPM signal 131. Accordingly, the harmonic extractor 104 can extract harmonics of the engine sound over an RPM range. In extracting the harmonics from the transducer-processed sound in this manner, magnitude, phase, and/or frequency information may be extracted for each of the extracted harmonics $h_1$-$h_n$, which can be used to reproduce the character of the target engine sound.

The active sound management system 10 also includes a harmonic modifier 106 that processes the received source rotating frequency signal 131, the extracted harmonics $h_1$-$h_n$ and vehicle state parameters 133 to adjust a magnitude, phase, frequency, and/or other feature of the extracted harmonics $h_1$-$h_n$ to be within a threshold with respect to a target harmonic corresponding to the desired engine sound heard in the vehicle cabin 12. For example, the harmonic modifier 106 can receive from the sound generating source 102 an input signal 133 representative of engine load and/or other vehicle state parameters, and convert it to a control parameter signal, which is produced by the harmonic modifier 106 for balancing or otherwise controlling the overall sound level of the harmonic enhancement. For example, the engine load signal 133 may be representative of the engine torque, whereby an engine load detector (not shown) may convert the torque measurement to an engine load measurement. The load processor 105 can receive a torque signal from the input signal 133 and determine a control parameter based on the torque signal. Other vehicle state parameters may include but not be limited to mass air flow, manifold absolute pressure, accelerator position, gear position, vehicle speed, speed limiter, and driveshaft speed.

The signal 133 representing engine load is well suited for controlling sound enhancement level for at least two reasons. First, overall engine noise levels increase monotonically with increasing positive engine loads. Second, strong enhancement is typically desirable only for positive engine loads, when the engine propels the transmission. Negative engine loads occur when the transmission propels the engine, also known as engine brake. While there may be high levels of inherent engine noise during engine brake, noise cancellation may be desired for this situation but significant sound enhancement is rarely desired. The harmonic modifier 106 may use the engine load, the change in engine load, the RPM, and the rate of change in RPM to determine a gain which adjusts the harmonic enhancement level.

The fundamental frequency, derived from RPM signal 131, is used by the harmonic extractor 104 as a reference signal for an adaptive filter that estimates the harmonics in order to extract, or separate, the harmonics from other noise in the transducer signal 132. Accordingly, harmonic modifier 106 also receives as inputs the RPM signal 131 and the extracted harmonics $h_1$-$h_n$ along with the load signal 133, determines the individual gain adjustments for each of the harmonics $h_1$-$h_n$, and outputs the adjusted harmonic signals $h'_1$-$h'_n$ that are electrically summed to produce the output signal 138, from which the output sound is played from a speaker 108, to achieve a desired sound in the vehicle cabin 12.

Figure 2:
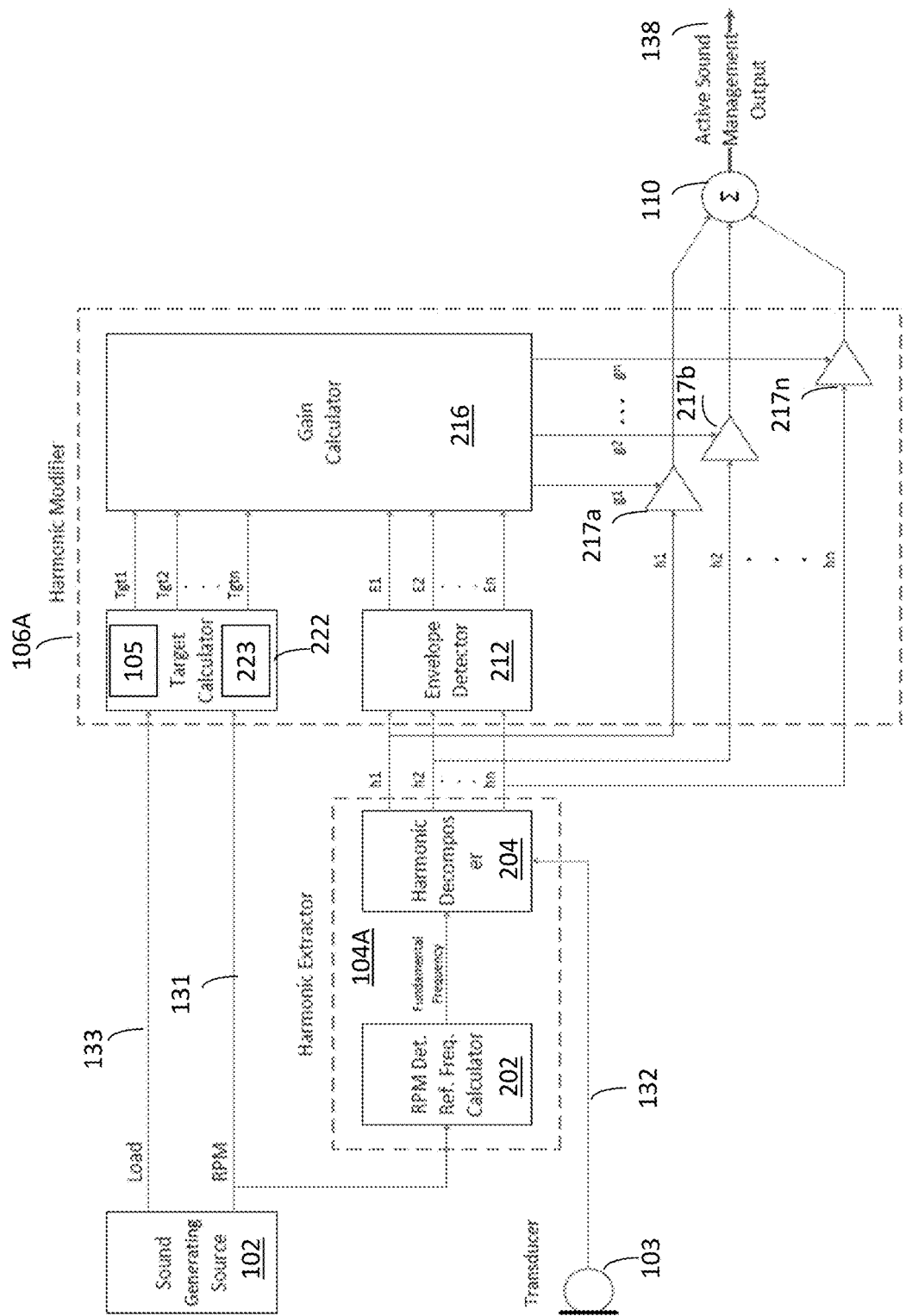
FIG. 2 is a detailed block diagram of a harmonic extractor and harmonic modifier of an active sound management system, in accordance with some examples.

FIG. 2 is a detailed block diagram of a harmonic extractor 104A and harmonic modifier 106A of the active sound management system 10 of FIG. 1.

As described with reference to FIG. 1, the harmonic extractor 104A extracts a plurality of harmonics $h_1$-$h_N$ (where N is the total number of harmonics considered) based on a reference frequency generated in response to the received RPM signal 131.

The harmonic extractor 104A includes an RPM detection and reference frequency calculator 202 and a harmonic decomposer 204. The RPM detection and reference frequency calculator 202 receives as input the RPM signal 131, which is indicative of an engine speed in RPM, and determines from the RPM signal 131 the fundamental frequency of the engine harmonics. The RPM detector and reference frequency calculator 202 is operationally coupled to the harmonic decomposer 204, which extracts harmonics from a signal 132 received by the transducer 103. The RPM signal 131 is used by the harmonic decomposer 204 as a reference signal for an adaptive filter that estimates the harmonics in order to extract, or separate, the harmonics from other noise in the transducer signal 132. The harmonic extraction/decomposition process can be implemented using an adaptive algorithm, band-pass filtering, and so on. The harmonic decomposer 204 may include a plurality of frequency converters (not shown) for calculating the center frequency of each harmonic, which is a multiple of the fundamental frequency. The harmonic decomposer 204 extracts harmonic signals $h_1$-$h_N$ respectively.

The harmonic modifier 106 may include a target calculator 222 that determines a plurality of target harmonics ($Tgt_k$), where k=1 to n, and refers to a particular harmonic, of the fundamental frequency of the RPM signal 131.

In some examples, the target calculator 222 may receive an input signal 133 representative of engine load and/or other vehicle state parameters. For example, the input signal 133 signal may be representative of the engine torque, whereby the target calculator 222 may include an engine load processor 105 that converts the torque measurement to an engine load measurement. Alternatively, the load processor 105 may be a separate element that performs this function and provides the result to the target calculator 222.

The target calculator 222 may determine a specific harmonic magnitude and phase as a function of RPM and engine load. The target calculator 222 may include a plurality of harmonic lookup tables (LUTs) 223, for example, which associates values of the received RPM signal 131 with fundamental frequency values, and determines target values $Tgt_1$-$Tgt_n$ for the harmonics $h_1$-$h_n$. Alternatively, the magnitude and/or phase may be calculated or approximated according to a formula, for example, a function (RPM, load).

The harmonic modifier 106 includes an envelope detector 212 that generates from the received harmonic signals $h_1$-$h_n$ an estimate value $E_k$ (where k=1 to n) for adjusting the harmonics $h_1$-$h_n$ respectively. The estimate values $E_1$-$E_n$ provide an estimated envelope, of the corresponding harmonic signals $h_1$-$h_n$ for example, from a smoothing process over a window of time. The estimate values $E_1$-$E_n$ are used by a gain calculator 216, in combination with target signals $Tgt_1$-$Tgt_n$, for determining the individual gain adjustments $g_1$-$g_n$ for the harmonics $h_1$-$h_n$.

The gain calculator 216 may function as a comparator between the target harmonics $Tgt_1$-$Tgt_n$, and the estimated envelopes $E_1$-$E_n$ of harmonics with the goal of determining gain values of harmonics for the resulting sound in cabin to be at or close to the target sound represented by target harmonics. In particular, the harmonic controller 216 can compute a gain ($g_k$), where k=1-n, calculated by: $g_k = Tgt_k / E_k$.

In some examples, a plurality of harmonic gain devices 217a-217n are at an output of the gain calculator 216 for adjusting the harmonics $h_1$-$h_n$ by the calculated gains $g_1$-$g_n$. The gain devices 217a-217n are operationally coupled for electrical summation 110 of the adjusted harmonic signals $h'_1$-$h'_n$ to produce the output signal 138, from which the output sound is played from a speaker 108, to achieve a desired sound in the vehicle cabin 12. The resulting enhancement can therefore be acoustically summed with the inherent harmonic sound level, producing a sound level which matches a desired target.

In some examples, as described herein with reference to FIG. 2, the active sound management processing occurs by using a complex gain with respect to adjusting a magnitude of a harmonic signal. However, the concepts are not limited thereto. For example, the envelope detector 212 described in FIG. 2 can function as a statistics calculator in cases where other statistical information for harmonic modification is used. In some embodiments, the harmonic modification process may pertain to phase and/or frequency in addition to or instead of magnitude.

Figure 3:
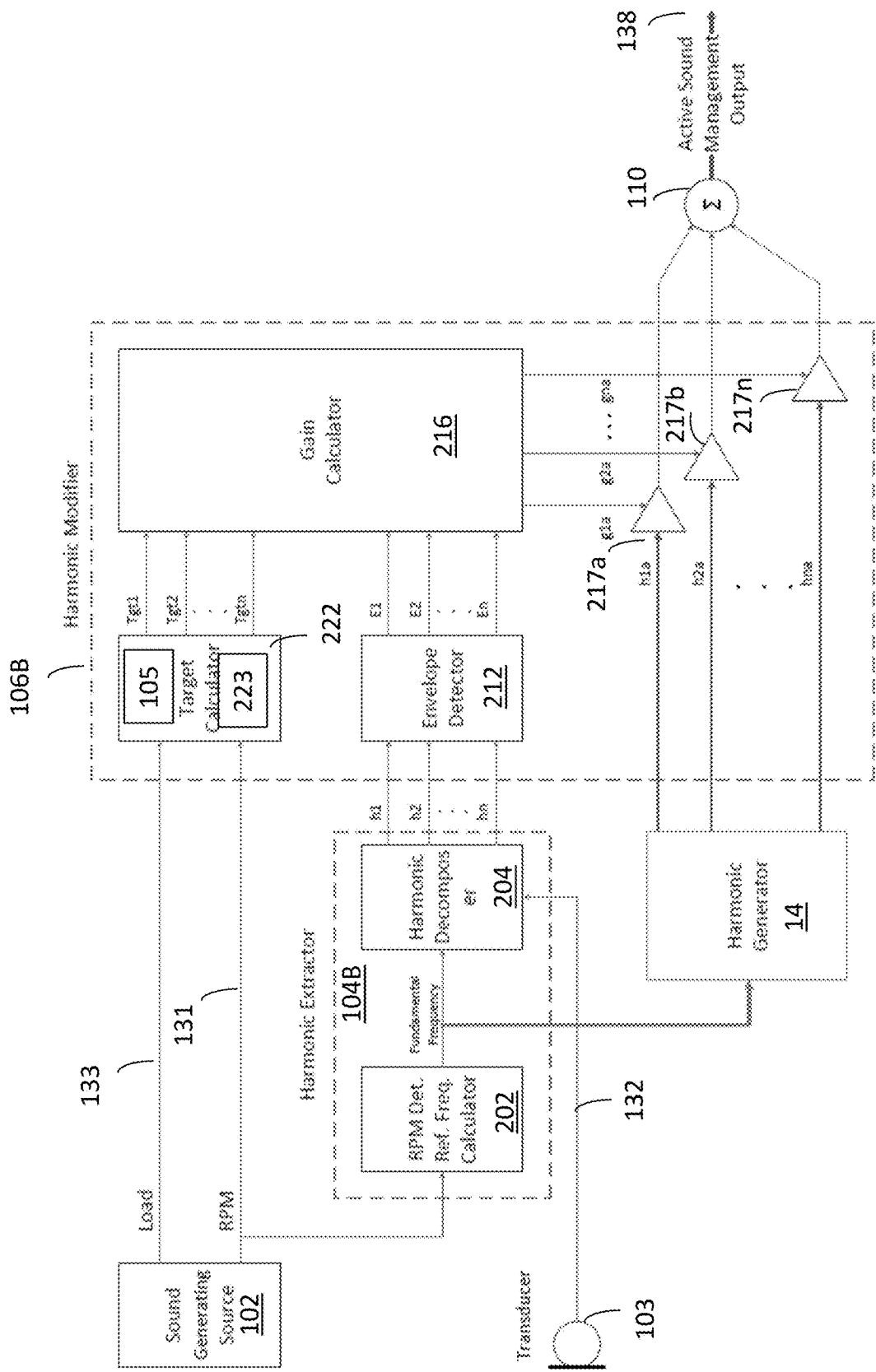
FIG. 3 is a detailed block diagram of a harmonic extractor and harmonic modifier of an active sound management system, in accordance with other examples.

FIG. 3 is a detailed block diagram of a harmonic extractor 104B and harmonic modifier 106B of an active sound management system, in accordance with other examples. The system shown in FIG. 3 is similar to that of FIG. 2, except that the extracted harmonics $h_1$-$h_n$ are only used for determining gains of harmonics, for generating sound enhancement, and that a standalone harmonic generator, for example, known to those of ordinary skill in the art, is provided for generating harmonics $h_{1a}$-$h_{na}$, for example, using a lookup table or the like at a harmonic generator 14 for generating sine wave signals in the conventional manner. Other elements of the system illustrated in FIG. 3 are the same or similar as those described with reference to FIG. 2, and are not repeated for brevity.

Figure 4:
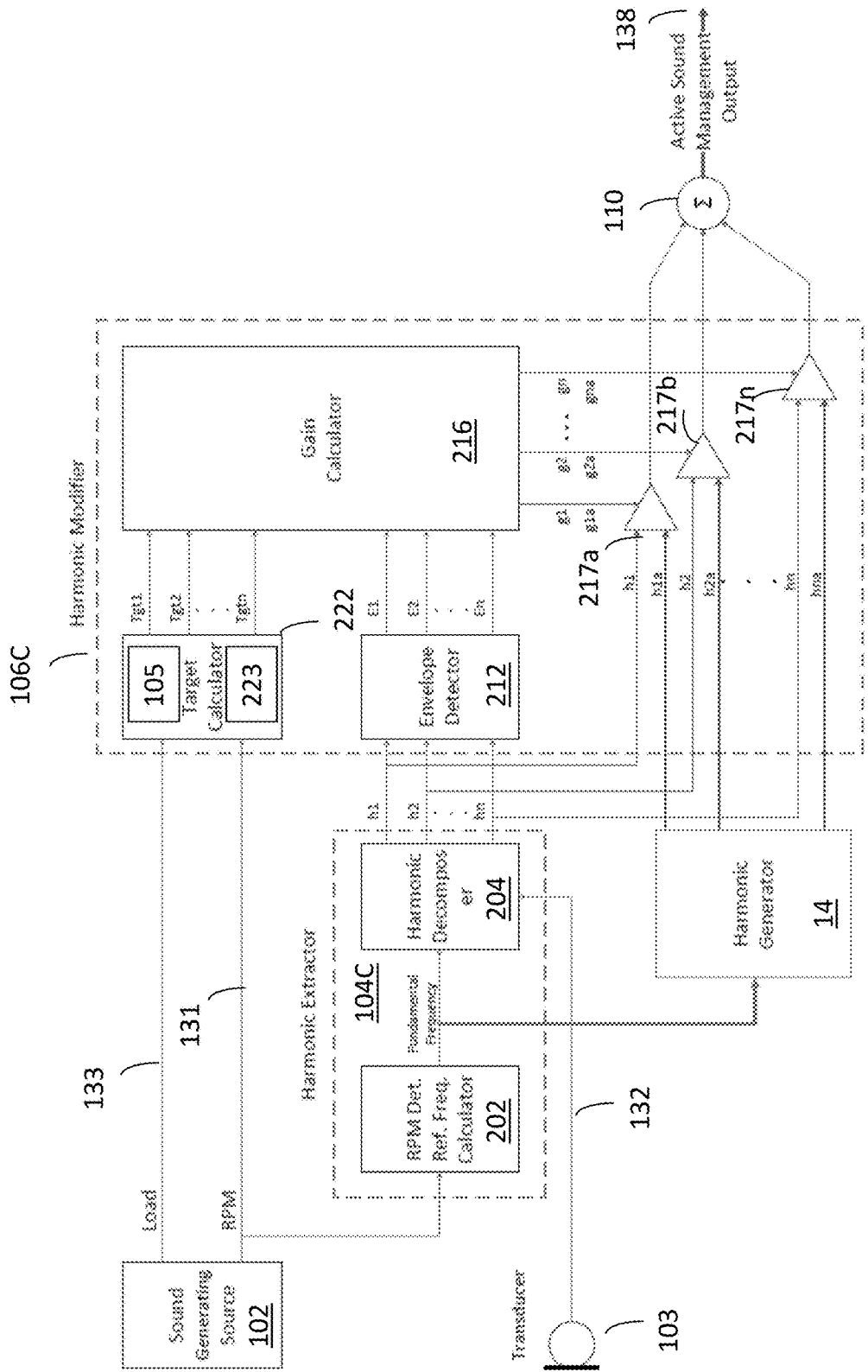
FIG. 4 is a detailed block diagram of a harmonic extractor and harmonic modifier of an active sound management system, in accordance with other examples.

FIG. 4 is a detailed block diagram of a harmonic extractor 104C and harmonic modifier 106C of an active sound management system, in accordance with other examples. FIG. 4 illustrates a case where both extracted harmonics $h_1$-$h_n$ and generated harmonics $h_{1a}$-$h_{na}$ are used for enhancement output. In particular, each harmonic gain device 217a-217n receives as inputs an extracted harmonic and a generated harmonic which are adjusted by calculated gains $g_1$-$g_n$, and $g_{1a}$-$g_{na}$, respectively. The gain devices 217a-217n are operationally coupled for electrical summation 110 of the adjusted harmonic signals $h'_1$-$h'_n$ to produce the output signal 138. Other elements of the system illustrated in FIG. 4 are the same or similar as those described with reference to FIG. 2, and are not repeated for brevity.

Figure 5:
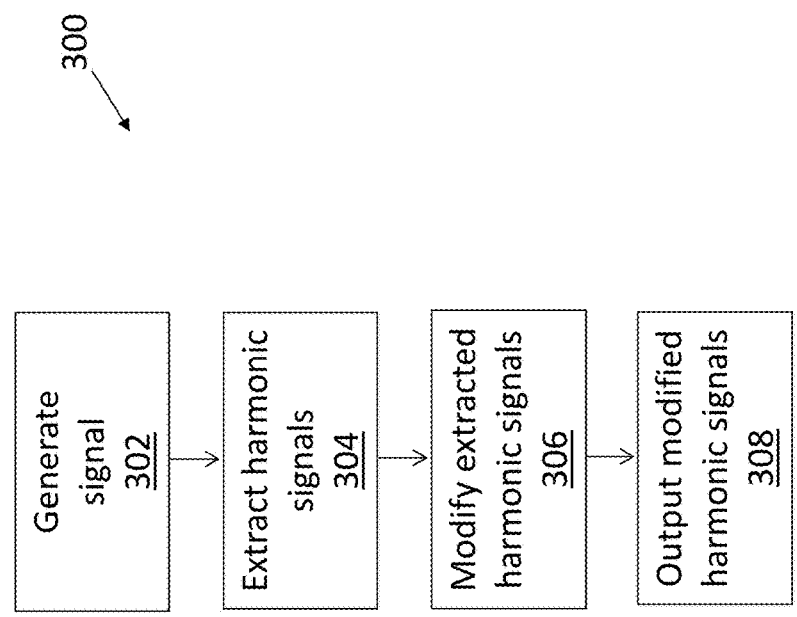
FIG. 5 is a flow diagram of a method for vehicle engine sound enhancement, in accordance with some embodiments.

FIG. 5 is a flow diagram of a method 300 for vehicle engine sound enhancement, in accordance with some embodiments. In some examples, some or all of the method 300 can be performed by the active sound management system 10 of FIGS. 1-4.

At block 302, a transducer 103 senses an actual sound or vibration from a sound generating source and generates a corresponding signal.

At block 304, a set of harmonic signals $h_1$-$h_n$ are extracted from the received transducer signal.

At block 306, the extracted harmonic signals $h_1$-$h_n$ are modified, for example, adjusted harmonic signals $h'_1$-$h'_n$ illustrated in FIG. 1, by multiplying the harmonics $h_1$-$h_n$ by calculated gains $g_1$-$g_n$.

At block 308, the modified harmonic signals $h'_1$-$h'_n$ are electrically summed and output to a speaker 108 or related device for producing a sound from which the resulting sound in a vehicle cabin, an acoustic summation of output from one or more speakers, and an actual sound from source, is at or close to a desired engine sound in the vehicle cabin.

FIGS. 6A and 6B are spectrogram graphs of an example comparison, where FIG. 6A represents harmonics generated in a conventional engine harmonic enhancement (EHE) system and FIG. 6B represents harmonics extracted in accordance with some examples. The comparison between FIG. 6A and FIG. 6B clearly illustrates that the extracted harmonics contain frequency components in a wider range of frequencies compared to the generated harmonics, and preserve the desired characteristics of a sound in a superior way. The resulting sound from extracted harmonics is, therefore, more natural and less tonal.

A number of implementations have been described. Nevertheless, it will be understood that the foregoing description is intended to illustrate and not to limit the scope of the inventive concepts which are defined by the scope of the claims. Other examples are within the scope of the following claims.

What is claimed is:

1. An active sound management system, comprising:
a transducer that senses an actual sound or vibration from a sound generating source and generates a transducer signal in response to sensing the actual sound or vibration;
a harmonic extractor device that extracts a plurality of harmonics from the transducer signal; and
a harmonic modifier device that adjusts a feature of each of the extracted harmonics to be within a predetermined threshold with respect to a target harmonic corresponding to a desired sound, wherein the harmonic modifier device comprises a target calculator that generates for the harmonics the plurality of target harmonics related to a fundamental frequency of an input signal to the harmonic extractor device and the harmonic modifier device; wherein the target calculator comprises a load processor that converts a torque measurement in the input signal representative of a vehicle state parameter received by the target calculator to an engine load measurement, wherein the target calculator determines a harmonic magnitude and phase as a function of RPM data and engine load data provided in the input signal, and wherein the harmonic modifier device further generates an individual gain adjustment by processing each extracted harmonic with a target harmonics value of the plurality of target harmonics to generate the desired sound.

2. The active sound management system of claim 1, wherein the target calculator comprises a plurality of harmonic lookup tables (LUTs), which associate values of the received RPM data with fundamental frequency values, and determines target harmonics values of the target harmonics.

3. A harmonic modifier device, comprising:
a target calculator that generates a plurality of target harmonics related to a fundamental frequency of an input signal;
an envelope detector that generates from a plurality of harmonic signals extracted from an engine sound a plurality of estimate values that provide an estimated envelope of the corresponding harmonic signals, from a smoothing process over a window of time;
a gain calculator that processes the estimate values and the target harmonics for determining individual gain adjustments for the extracted harmonic signals; and
a plurality of gain devices that generate adjusted harmonic signals from the gain adjustments and the extracted harmonic signals.

4. The harmonic modifier device of claim 3, wherein the target calculator comprises:
a load processor that converts a torque measurement in the input signal representative of a vehicle state parameter received by the target calculator to an engine load measurement, and determines a harmonic magnitude and phase as a function of RPM data and engine load data provided in the input signal.

5. The harmonic modifier device of claim 4, wherein the target calculator comprises a plurality of harmonic lookup tables (LUTs), which associate values of the received RPM data with fundamental frequency values, and determines target harmonics values of the target harmonics.

6. A vehicle engine harmonic signal enhancement system, comprising:
   a device that provides a fundamental frequency corresponding to an revolutions per minute (RPM) of a vehicle engine;
   a transducer that generates a signal in response to sensing an output from the vehicle engine;
   a harmonic extractor device that extracts the individual harmonics from the transducer signal;
   a comparator that compares each extracted harmonic with a target harmonic corresponding to a desired engine sound heard in a vehicle cabin proximal the vehicle engine; and
   a harmonic modifier device that adjusts a feature of the extracted harmonic to be within a threshold with respect to the target harmonic, and that further generates an individual gain adjustment by processing each extracted individual harmonic with the compared target harmonic to generate the desired engine sound.

7. The vehicle engine harmonic signal enhancement system of claim 6, wherein the feature of the harmonics includes a magnitude, phase, and/or frequency of the extracted harmonic.

8. The vehicle engine harmonic signal enhancement system of claim 6, wherein the harmonic extractor device comprises:
   a reference frequency calculator that receives a signal indicative of rotating speed of the sound generating source, and determines from the signal a fundamental frequency of the harmonics of the sound generating source; and
   a harmonic decomposer that multiplies the fundamental frequency of the harmonics by an order of each harmonic for calculating harmonic frequencies, and extracts the harmonics from the signal generated by the transducer accordingly.

9. The vehicle engine harmonic signal enhancement system of claim 6, wherein the harmonic modifier device comprises:
   a target calculator that generates a plurality of target harmonics related to a fundamental frequency of an input signal;
   an envelope detector that generates from a plurality of harmonic signals extracted from an engine sound a plurality of estimate values that provide an estimated envelope of the corresponding harmonic signals;
   a gain calculator that processes the estimate values and the target harmonics for determining individual gain adjustments for the extracted harmonic signals; and
   a plurality of gain devices that generate adjusted harmonic signals from the gain adjustments and the extracted harmonic signals.

10. The vehicle engine harmonic signal enhancement system of claim 9, wherein the estimated envelope is provided from a smoothing process over a window of time.

11. The vehicle engine harmonic signal enhancement system of claim 9, wherein the target calculator comprises:
   a load processor that converts a torque measurement in the input signal representative of a vehicle state parameter received by the target calculator to an engine load measurement, and determines a harmonic magnitude and phase as a function of RPM data and engine load data provided in the input signal.

12. The vehicle engine harmonic signal enhancement system of claim 11, wherein the target calculator comprises a plurality of harmonic lookup tables (LUTs), which associate values of the received RPM data with fundamental frequency values, and determines target harmonics values of the target harmonics.

* * * * *